US005569355A

United States Patent [19]

Then et al.

[11] Patent Number: 5,569,355

[45] Date of Patent: Oct. 29, 1996

[54] METHOD FOR FABRICATION OF MICROCHANNEL ELECTRON MULTIPLIERS

[75] Inventors: Alan M. Then, Auburn, Mass.; Steven M. Shank, Ithaca; Robert J. Soave, Cortland, both of N.Y.; G. William Tasker, West Brookfield, Mass.

[73] Assignee: Center for Advanced Fiberoptic Applications, SouthBridge, Mass.

[21] Appl. No.: 371,548

[22] Filed: Jan. 11, 1995

[51] Int. Cl.[6] .............................. H01L 21/00; B44C 1/22

[52] U.S. Cl. .................................... 156/643.1; 156/644.1; 156/651.1; 156/657.1; 156/628.1; 216/24; 216/33; 216/62

[58] Field of Search ................................ 216/24, 56, 62, 216/66, 67, 99, 33; 156/643.1, 651.1, 657.1, 628.1, 644.1; 313/103 CM

[56] References Cited

U.S. PATENT DOCUMENTS

| | | | |
|---|---|---|---|
| 5,086,248 | 2/1992 | Horton et al. | 313/103 CM |
| 5,205,902 | 4/1993 | Horton et al. | 156/643 |
| 5,378,960 | 1/1995 | Tasker et al. | 313/103 CM |

OTHER PUBLICATIONS

Lee & Zhou, Feature–Size Dependence of Etch Rate in Reactive Ion Etching, J. Electrochem. Soc., vol. 138, Aug. 91, pp. 2439–2445.

Zarowin, A Theory of Plasma–Assisted Chemical Vapor Transport Processes, J. Appl.Phys. 57(3), 1 Feb. 95, pp. 929–942.

Kuiper et al., Thermal Oxidation of Silicocn Nitride and Silicon Oxynitride Films, J. Vac. Sci. Technol. B7 (3), May/Jun. 89, pp. 455–465.

Pan & Berry, The Composition and Physical Properties of LPCVD Silicon Nitride . . . , J. Electrochem. Soc., Dec. 85, pp. 3001–3005.

Makino, Composition and Structure Control by Source Gas Ratio in LPCVD, J. Electrochem. Soc., vol. 130, No. 2, Feb. 83, pp. 450–455.

Keller et al., Milli–Scale Polysilicon Structures, 1994 TRF, pp. 132–137.

Sekimoto et al., Silicon Nitride Single–Layer X–Ray Mask, J.Vac.Sci. Technol., 21(4), Nov./Dec. 1982, pp. 1017–1021.

Coburn et al., Conductance Considerations in the Reactive. . . , Appl. Phys. Lett. 55(26), 25 Dec. 89, pp. 2730–2732.

Beck et al., Low Stress Silicon Nitride and Polysilicon Films. . . , Mat.Res.Soc.Symp.Proc. vol. 182, 1990, pp. 207–212.

Petersen, Silicon as a Mechanical Material, Proceedings of the IEEE, vol. 70, No. 5, May 1982, pp. 420–457.

*Primary Examiner*—William Powell

*Attorney, Agent, or Firm*—Watson Cole Stevens Davis, P.L.L.C.

[57] ABSTRACT

The present invention discloses a method for constructing a completely micromachined MCP that is activated with thin-film dynodes wherein the interchannel regions are first dry etched in the substrate, resulting in channel pillars. The etched portions of the substrate are then back filled and the channel pillars are thereafter removed to produce a micromachined perforated microchannel plate. The technique may be employed to produce an active element for an integrated image tube or photomultiplier tube.

26 Claims, 3 Drawing Sheets

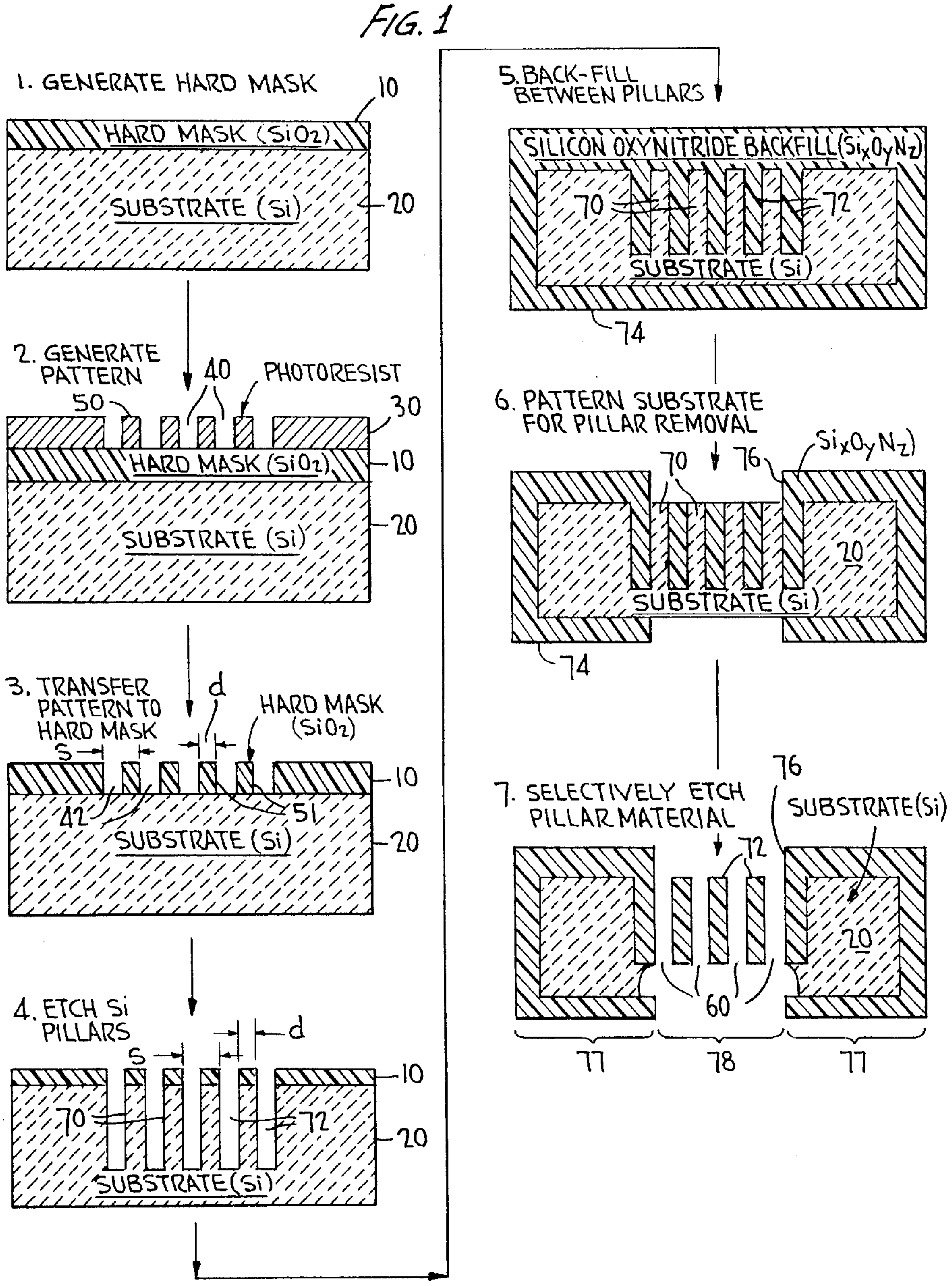
FIG. 1
1. GENERATE HARD MASK
HARD MASK (SiO2)
SUBSTRATE (Si)
10
20
2. GENERATE PATTERN
40
PHOTORESIST
50
30
HARD MASK (SiO2)
10
SUBSTRATE (Si)
20
3. TRANSFER PATTERN TO HARD MASK
d
HARD MASK (SiO2)
S
10
42
51
SUBSTRATE (Si)
20
4. ETCH Si PILLARS
d
S
10
70
72
20
SUBSTRATE (Si)
5. BACK-FILL BETWEEN PILLARS
SILICON OXYNITRIDE BACKFILL (SixOyNz)
70
72
SUBSTRATE (Si)
74
6. PATTERN SUBSTRATE FOR PILLAR REMOVAL
70
76
SixOyNz)
20
SUBSTRATE (Si)
74
7. SELECTIVELY ETCH PILLAR MATERIAL
76
SUBSTRATE(Si)
72
20
60
77
78
77

FIG. 2

5. BACK-FILL BETWEEN PILLARS. THIS PROCESS STEP IS IDENTICAL TO THAT DISCUSSED PREVIOUSLY.

6. PATTERN FRONT-SIDE OF SUBSTRATE TO INITIATE PORE FUNNELING WITH PARTIALLY SELECTIVE ETCH.

7. BEGIN ETCHING PILLAR FROM FRONT-SIDE WITH PARTIALLY SELECTIVE ETCHANT TO GENERATE FUNNELED PORES.

8. PATTERN BACK-SIDE OF SUBSTRATE AND COMPLETE REMOVAL OF PILLARS WITH HIGHLY SELECTIVE ETCH.

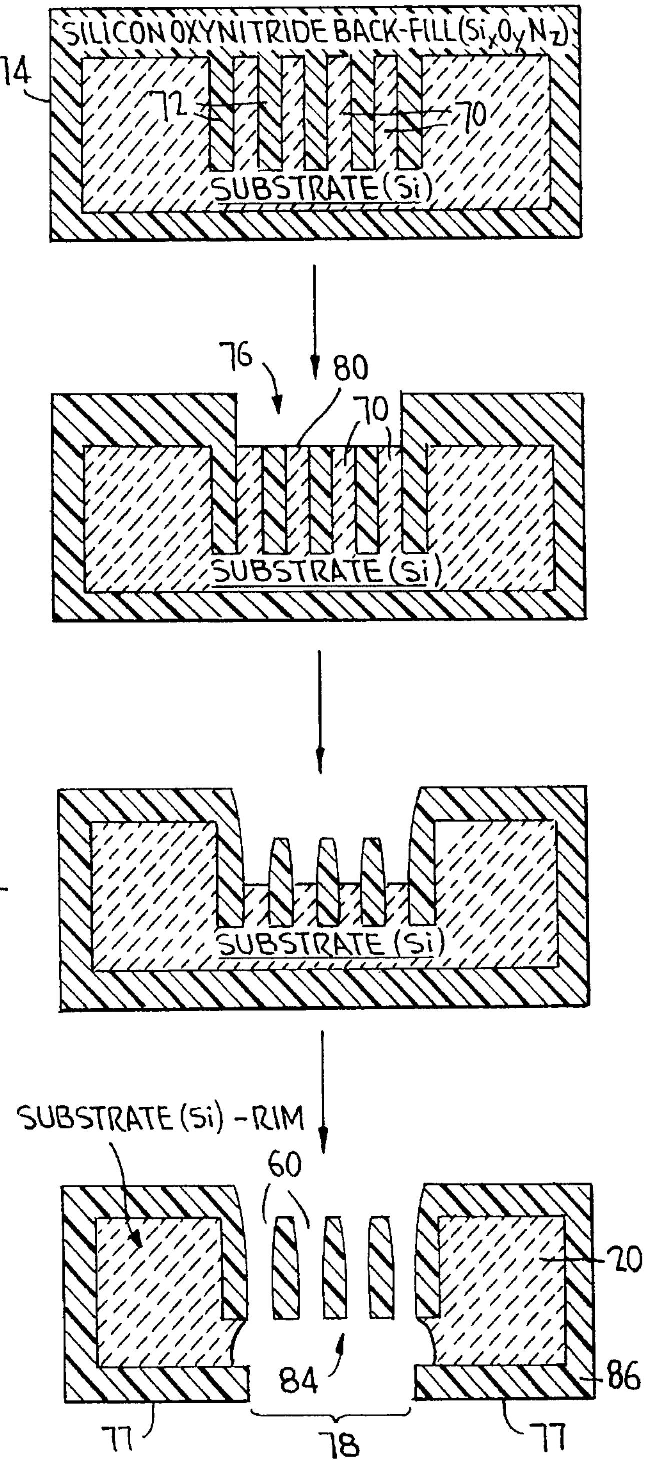

METHOD FOR FABRICATION OF MICROCHANNEL ELECTRON MULTIPLIERS

GOVERNMENT RIGHTS

The invention was made with support of the United States Government under a program awarded by the National Institute of Standards and Technology (Award #70NANB3H1371) to Galileo Electro-Optics Corporation. The Government has certain rights in this invention.

BACKGROUND OF THE INVENTION

The invention is directed to a method of forming deep, highly anisotropic pores for microchannel plates (MCP). In particular, the present invention describes a fabrication method for a micromachined MCP, which addresses various practical limitations in current techniques, and offers substantial added flexibility for the construction of a bulk semiconducting MCP. This disclosure also details an ultra-compact, microfabricated image tube and photomultiplier tube which incorporate micromachined MCPs of any construction.

The invention is related to the method for making microchannel plates described in U.S. Pat. Nos. 5,086,248 (1992) and 5,205,902 (1993) by J. R. Horton and G. W. Tasker, assigned to Galileo Electro-Optics Corporation, the assignee herein. The dynode structure and activation methods used for the invention are described in U.S. Pat. No. 5,378,960 by G. W. Tasker and J. R. Horton, assigned to Galileo Electro-Optics Corporation, the assignee herein. The teachings of the above-identified patents are incorporated herein by reference.

The basic methodology of the process described in U.S. Pat. No. 5,205,902 employs a directionally applied flux of reactive particles against at least one face of a substrate wafer to produce a series of highly anisotropic, high aspect ratio, parallel microchannels which are then activated with thin films to make an electron multiplier. The applied flux of reactive particles is produced by one of several methods of reactive plasma etching (RPE). As defined herein, the aspect ratio (∝) refers to the depth of a pore (1) divided by its width (d). (1 and d are conventional terms known to those skilled in the art, and are related to the terms length and diameter in circular channel electron multipliers.)

During RPE of pores, the etch rate of the substrate material tends to decrease with increasing ∝. This effect is enhanced for pore diameters less than roughly 5 μm and thus slows RPE of pores with diameters and aspect ratios suitable for microchannel plates. This reduction in etch rate may be the result of many different physical processes and is discussed in the literature. One physical process thought to produce this effect is a transport limitation of the reaction products of the etch out of the pore beyond some threshold aspect ratio and is generally referred to a microloading. The process is analogous to molecular flow conductance limits in vacuum systems. Another physical process which may decrease the etch rate with increasing aspect ratio is the deflection of reactive ions away from the bottom of the pore into the sidewall due to electric field effects at the pore opening. This is generally referred to as reactive ion etching (RIE) lag. Both of these effects, as well as other related effects, makes directly etching high aspect ratio, small pore with d of approximately 1 μm difficult and time consuming.

As described in U.S. Pat. No. 5,205,902, the substrate used for the microchannel electron multiplier must be masked with a photo-patterned, etch resistant material. Very often, this mask material is dielectric, such as an oxide or nitride, since these materials have slow etch rates in RPE compared to the semiconductor materials used for the MCP substrate in one embodiment. However, an alternate embodiment specifies a dielectric material for the MCP substrate. Since the etch rate of the dielectric substrate is slow, the selection of suitable etch masks is limited for forming deep high aspect ratio channels. The slow etch rate can be addressed in part by newly available high-density plasma etch techniques such as inductively coupled plasma (ICP) etching and electron cyclotron resonance (ECR) etching, however, the selectively of the mask to the substrate is still an issue.

Relatively thick metals (e.g., ≧1 um) can be used as etch masks for these dielectrics. However, patterning thick metal is difficult and time consuming. Together these difficulties limit the practical manufacturability and commercial viability of micromachined MCPs constructed by direct etching of pores in dielectric materials.

BRIEF DESCRIPTION OF THE DRAWINGS

FIG. 1 is a stepwise illustration (steps (1)–(7)) of the method according to one embodiment of the invention;

FIG. 2 is a stepwise illustration (steps (5)–(8)) of a variation of the method of FIG. 1 according to another embodiment of the invention;

Figure 3A:
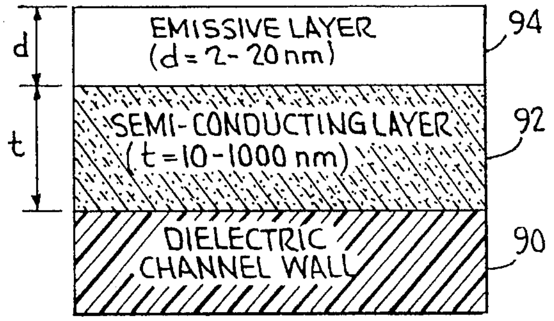
FIGS. 3A–3B are schematic illustrations of various thin-film dynodes useful for dielectric and semiconductive MCP substrates respectively.

In the drawings, the relative scale of dimensions are enlarged for clarity.

SUMMARY OF THE INVENTION

The present invention is based upon the discovery of a method for constructing a completely micromachined MCP that is activated with thin-film dynodes wherein the continuous interchannel region is dry etched in the substrate, resulting in an array of pillars. The etched portions of the substrate are back filled with an etch resistant membrane material and the pillars are thereafter removed by wet etching to produce a micromachined perforated body such as a microchannel plate. Some of the process techniques of this method are the same as those employed and described in U.S. Pat. No. 5,205,902, Method of Manufacturing Microchannel Electron Multipliers issued to Galileo Electro Optics. However, the application of the process techniques is expanded as herein described to improve the manufacturability, cost, and flexibility of the end product.

In a particular embodiment, the method may be used specifically with a Si substrate. This takes advantage of the wide availability and low cost of Si and allows the use of known etch mask materials. It also facilitates integration into further MOS processing by avoiding material compatibility problems that materials such as GaAs might present. The method is equally applicable to both surface and bulk semiconducting MCPs.

In general, the method comprises forming an etch mask layer on a semiconductor substrate; producing a pattern in the etch mask layer; applying a flux of reactive particles against the masked substrate to transfer the pattern from the mask to the substrate; back-filling the etched portions of the substrate with an etch resistant membrane material; and selectively removing the substrate material with respect to the etch resistant material to produce a perforated membrane.

In a particular embodiment, the substrate is patterned so as to result in an article in the form of a rimmed microchannel plate with a perforated membrane. The channels therein are then activated with a thin-film dynode. In yet another embodiment, the technique may be employed to produce an active element for an integrated image or photomultiplier tube.

DESCRIPTION OF THE INVENTION

A general flow diagram of the process according to the invention is shown in FIG. 1, steps (1)–(7). The process begins by generating a hard mask 10 on a substrate 20, step (1). The mask 10 may be selected from one or a combination of common materials including polymers, dielectrics, metals and semiconductors. An exemplary mask 10 is $SiO_2$ produced by either direct thermal oxidation of the silicon or by chemical vapor deposition (CVD). Liquid phase deposition (LPD) is also a possible alternative deposition technique.

The hard mask 10 is coated with a photo-sensitive polymer 30 and a pattern 40 is generated in the photoresist 30 by optical lithography, step (2). Other lithographic methods can be employed such as electron-beam, ion-beam or x-ray lithography. However, photolithography is readily available and less expensive than other lithographic processes. In the process sequence described here, the pattern 40 is in the form of a two-dimensional array of pads 50 which define the size (e.g., width d) of the eventual pores 60 (see step (7)) to be formed there below and pitch (e.g., s) between the pores. It is possible to employ several alternative processes in patterning the hard mask 10, including such processes as lift-off and tri-level patterning. The particular choice will depend on the desired thickness of the hard mask 10 and to some extent on the equipment available to the manufacturer. It should be understood that the layer 30 may also comprise metal-polymer or dielectric-polymer composite layers. Regardless of how the pattern 40 is initially generated in the photoresist 30 or its composite composition, the pattern 40 is transferred as a pattern 42 into the hard mask by RPE to form corresponding transferred isolated pads 52, step (3).

The isolated pads 52 of hard mask 10 are then used to make an array of pillars 70 which are dry etched via an applied flux of reactive particles into the silicon substrate 20 using processes as described in Horton et al., step (4). The applied flux of reactive particles for RPE can be a direction-specific ion beam and/or glow discharge. In the present invention, however, pillars 70 are etched instead of isolated pores. Since the pitch s between pillars 70 is larger than the pore width d, and because multiple escape paths for reaction products exist for an array of pillars, the transport of the reaction products of the etch is enhanced resulting in a substantial increase in etch rate ($R_E$). The benefit is somewhat difficult to quantify since the $R_E$ is not constant with etch depth. However, a single point comparison is instructive. In one etching regime an increase in $R_E$ of 300% was experimentally observed for pillars as compared to pores of similar dimension d. While processing conditions have been found where the etch rate $R_E$ of pillars and pores (with d of 1 to 5 microns) are almost identical, a limit on aspect ratio beyond which RIE lag and microloading decrease the etch rate is generally observed and is always greater for pillars. The importance of this result is the direct impact of etch rate on the economic viability of micromachined MCPs.

After the pillars 70 are etched in step (4), the space 72 between the pillars is back filled with an etch resistant membrane material 74, step (5). This process step is a precursor to the production of pores 60 from the pillars 70. Additionally, this step adds significant design flexibility in the production of a bulk semiconducting MCP.

In a particular embodiment, the back filling step (5) comprises depositing the membrane material 74 between the pillars 70, e.g., primarily $SiO_2$, $Si_3N_4$ and $Si_xN_yO_z$. Although other dielectric and semiconductor materials may be used, these materials are useful because of their high etch resistance to wet chemical etchants hereinafter described. The deposition may be accomplished by low pressure chemical vapor deposition (LPCVD) using an exemplary precursor system of dichlorosilane ($SiCl_2H_2$), and at least one of nitrous oxide ($N_2O$) and ammonia ($NH_3$). This system provides excellent conformality and flexibility for tailoring properties such as thermal stability, hermeticity, stress and crack resistance which are important for subsequent processing and device performance. Additionally, the electrical resistivity range available with this precursor system is important to the flexibility of this method. It allows manufacture of both surface conducting and bulk semiconducting MCPs. Bulk semiconducting MCPs require materials with resistivities of $10^8$ to $10^{11}\Omega\cdot cm$, while surface conducting MCPs require substrates with resistivities in excess of $10^{12}\Omega\cdot cm$. There are other precursor systems that may be employed, such as $AlCl_3/NH_3/H_2/O_2$ for deposition of AlN and $Al_2O_3$ or $SiCl_4/CH_4/H_2$ for deposition of SiC. However, the exemplary $SiCl_2H_2/N_2O/NH_3$ system is flexible and proven.

An alternative method for back filling the space 72 between the pillars 70 would be to take advantage of the volume expansion of thermally growth silicon dioxide. When Si is thermally oxidized the Si is consumed and replaced by $SiO_2$. For every ~90 nm of Si thus consumed ~200 nm $SiO_2$ are produced. Thus, the space 72 between the pillars 70 can be partially or completely filled by partially oxidizing properly sized and positioned pillars 70. This method is somewhat more limited than using LPCVD for a surface conducting MCP; however, it is exceptionally simple in concept. Yet another deposition technique for back-filling the space 72 is liquid phase deposition, as described in Tasker et al.

The next step is to pattern the back filled pillars prior to pillar removal. For example, as shown in step (6), selected portions of the back fill material 74 on opposing faces of the substrate 20 align with the long axes of the pillars 70 may be removed to form etch access areas 76. These areas may be produced by machining, dry etching or wet etching.

The last step (step 7) for constructing the microchannel array is to remove the pillar material 70 leaving a rim 77 supporting the central back fill membrane material 72 as a porous or perforated membrane area 78. In the exemplary embodiment, this is done with a selective wet isotropic etch. Selectivity, as it is defined herein, is the relative etch rate of any two materials. Thus, a selective etch is one in which the masking material, e.g., the back fill membrane material 72 has a low etch rate, and the sacrificial material, e.g., the pillar material 70, has a high etch rate. An exemplary etch method for silicon pillars 70 is wet chemistry. An exemplary etch system is an aqueous solution of HF and $HNO_3$ with or without acetic acid (HNA) which has excellent selectivity to silicon over nitride. Additionally, sodium hydroxide (NaOH) could also be used. There is almost infinite selectivity to Si over $Si_3N_4$ in NaOH, and the selectivity to Si over $SiO_2$ can be better than 500:1. The various compositions of $Si_xO_yN_z$, collectively referred to as silicon oxynitrides, should also exhibit excellent selectivity to Si in NaOH and HNA.

In some cases it may be advantageous to have an etch that is only moderately selective. FIG. 2 shows a modified process flow diagram, steps (5)–(8), that could be used to produce a MCP with a high open-area-ratio (OAR) input face, referred to as funneling. A high OAR is desirable for increasing the detection efficiency and signal-to-noise ratio of a MCP. In this arrangement, after back filling, step (5), the front side 80 of the substrate is patterned, step (6), and pillar etching is performed only from the front side with a moderately selective etch, step (7), thereafter the back side 84 is patterned and etched with a more highly selective etch, step (8). Increasing the OAR may also be achieved by tailoring the RPE process, step (4).

An anisotropic etch could be used to define an area 84 aligning with the Si pillars 70 before application of the selective isotropic etch to remove the pillars. The anisotropic etch could be done with potassium hydroxide (KOH). It is advantageous to leave the Si substrate 20 partially masked during the pillar removal so as to leave a supporting Si rim 77 which supports the etched through membrane area 78. The solid rim 77 surrounding the thin membrane 78 (<100 um thick) containing the pores 60 provides an excellent method of handling the MCP for future processing and application.

The aspect ratio ∝ of the completed channels can be further increased by two methods. First, additional dielectric material may be deposited in the completed pores 60, thereby decreasing the diameter of the pores. A second method for increasing the aspect ratio ∝ is to decrease the diameter of the sacrificial Si pillar 70 by thermally oxidizing the pillars prior to dielectric back fill. This second method is a direct benefit of the alternative method for back filling described above.

The selection of the oxynitride system is important to the construction of surface conducting and bulk semiconducting MCPs. The combination of the proper material systems, sacrificial support allowing for a rim and the enhanced throughput offered by etching pillars, not pores or trenches, makes the process a particularly useful method for fabricating MCPs. As noted, important advantages of the described method are the increased manufacturability through reduced aspect ratio dependent etch effects and design flexibility specifically applicable to MCPs.

If the previous processing has resulted in an insulating or dielectric channel wall 90 (FIG. 3A) of channels 60 (FIGS. 1 and 2), a semiconductive film 92 and an emissive film 94 may be deposited by LPCVD in accordance with Tasker et al. The film 92 would generally be n-type amorphous Si doped with various concentrations of nitrogen to obtain a desired device resistance for the MCP of between $(\mathbf{10})^6$ to $(\mathbf{10})^9$ Ohms. Alternatively, a p-type amorphous Si doped film, doped with such elements as arsenic, boron, or aluminum, may be used. Once the semiconductive film 92 is formed, an electron emissive layer 94 may then be formed. Generally, this may be accomplished by LPCVD of between about 2 to 20 nm of such materials as $SiO_2$, $Si_3N_4$ or $Si_xN_yO_z$ although $Al_2O_3$, AlN, C(diamond) or MgO would also serve as excellent candidates. Other methods for producing an electron emissive layer 94 include surface modification by thermal oxidation or nitriding or LPD techniques. As shown in FIG. 3B, if a bulk conducting channel wall 100 is employed, only an emissive layer 104 need be formed.

The table below shows properties and dimensions for the exemplary embodiments of FIGS. 3A and 3B.

TABLE

Figure 3B:
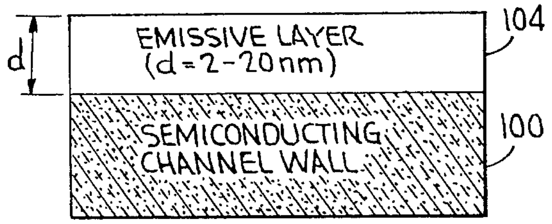

| | |
|---|---|
| I. | FIG. 3A |
| | Emissive Layer 94 - $SiO_2$ |
| | d . . . 2–20 nm |
| | δ . . . 1.2–3.8 for |
| | $E_p$ . . . 20–400 eV |
| | Semiconducting Layer 92 |
| | t . . . 10–1000 nm |
| | Undoped Si |
| | $R_s$ . . . $10^{11}$ – $10^{12}$ Ω/SQ |
| | N-Doped Si |
| | $R_s$ . . . $10^{12}$ – $10^{14}$ Ω/SQ |
| | Dielectric Channel Wall 90 |
| | $Si_xN_y$ (Silicon Nitride) |
| | $\rho > 10^{12}$ Ω · cm |
| II. | FIG. 3B |
| | Emissive Layer 104 |
| | $Si_3N_4$ |
| | d . . . 2–20 nm |
| | δ . . . 1.1–2.9 for |
| | $E_p$ . . . 20–400 eV |
| | Semiconducting channel wall 100 |
| | Silicon Oxynitride $Si_xO_yN_z$ |
| | ρ . . . $10^8$ Ω · cm |
| Where | δ is the secondary electron yield; |
| | $E_p$ is the electron collision energy; |
| | $R_s$ is the sheet resistance; and |
| | ρ is bulk electrical resistivity. |

A distinct advantage to a silicon based microchannel plate is the ability to apply other bulk and surface micromachining techniques. In particular, it should be possible to assemble a low-cost, ultra compact image or photomultiplier tube by employing a micromachined MCP with a so called field-assisted thermal bonding or anodic bonding technique illustrated in FIGS. 4A and 4B. Anodic bonding is an electrochemical process for low temperature (300° to 600° C.) fusion or sealing of alkali containing glass to metals or semiconductors. It is accomplished by heating the materials in contact and then applying a positive bias to the metal or semiconductor, relative to the glass, of the order of 100 to 1000 volts depending on the thickness of the component stack. Bonding can then take as little as several minutes depending primarily on the voltage, temperature and component stack. It should be understood that an image tube and a photomultiplier tube differ mainly in applications and in the photocathode material.

Figure 4A:
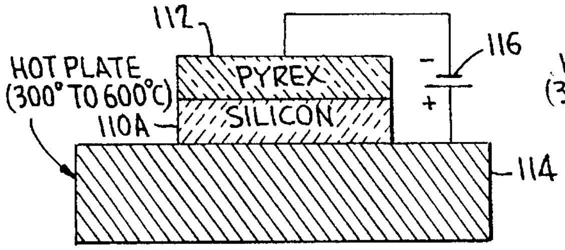
FIGS. 4A–4B are illustrations of anodic bonding techniques.
Figure 4B:
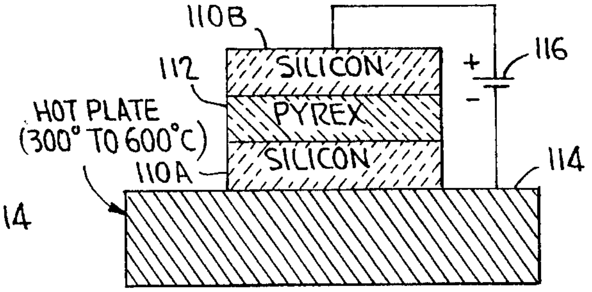

For example, semiconductive substrate 110A (FIG. 4A) may be bonded or sandwiched to a glass window 112 by means of a combination of heat from source 114 and an electric field supplied by voltage source 116 where the semiconductor 110A is biased positively (FIG. 4A). Additionally, substrates can be bonded to the fused stack of substrate 110A and window 112, one at a time by alternating glass and semiconductor substrates, as indicated for semiconductive substrate 110B (FIG. 4B). Important considerations in employing such a bonding method are the relative thermal expansion of the materials used and the cleanliness and flatness of the surfaces to be bonded.

In the present invention, the substrates 110A and 110B may be Si or $Si_xO_yN_z$ and the glass 112 bonded thereto may be a borosilicate glass (e.g., Corning 7740).

Figure 5A:
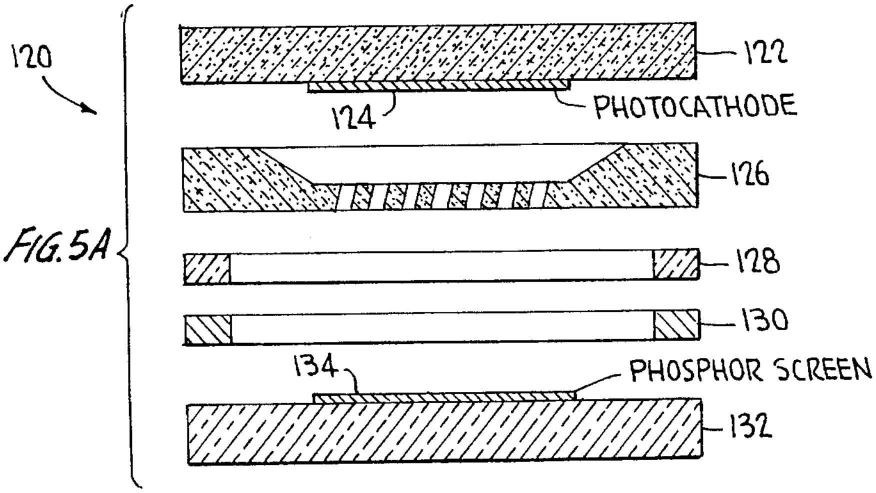
FIGS. 5A–5B are illustrations of an image or photomultiplier tube in accordance with an embodiment of the invention in an exploded and integrated form respectively.
Figure 5B:
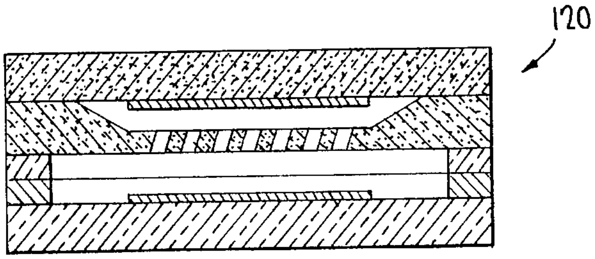

The components layers for an image or photomultiplier tube 120 would include an MCP as herein described or as described in U.S. Pat. No. 5,086,248, the teachings of which are incorporated herein by reference. The arrangement, illustrated in FIGS. 5A and 5B in respective exploded and assembled forms, includes a glass window 122, with a photocathode 124, micromachined MCP 126, a glass spacer 128, a silicon spacer 130, and a glass window 132 having a phosphor screen 134. Once the elements are bonded in vacuum, the image tube 120 having an integrated structure results, as shown in FIG. 5B. The bonding procedure can be practiced to produce micromachined image tubes or photomultiplier tubes with electronic readouts (e.g. CCDs and CIDs). The image and photomultiplier tubes thus produced are compact and modular in design. Exemplary dimensions of the various layers are set forth below.

| |
|---|
| Window 122 . . . Pyrex glass ~1 mm thick |
| MCP 124 . . . ~½mm thick Si |
| Spacer 128 . . . ~½mm Pyrex |
| Si Spacer 130 . . . ~½mm |
| Window 132 . . . ~½mm Pyrex |
| Overall . . . ~3 ½mm h × ~20 mm w |

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. A method of manufacturing a microchannel plate comprising the steps of:
   - forming a body of etchable material;
   - applying a flux of reactive particles against the body in selected areas for removing material from the selected areas;
   - back filling the selected areas with a membrane material;
   - selectively removing material adjacent the back filled areas to produce microchannels in the membrane material; and
   - activating the microchannels for electron multiplication by forming a continuous thin-film dynode therein.

2. The method of claim 1 wherein the thin-film dynode has a thickness of less than about 1,000 nm to exhibit secondary electron emissivity.

3. The method of claim 1 wherein the body is a wafer and the flux is applied against one face of said wafer.

4. The method of claim 1 further comprising the step of establishing communication between sides of the body.

5. The method of claim 3 wherein the flux is applied to the wafer for a time sufficient to produce a desired depth in the body.

6. The method of claim 5 further comprising the step of: establishing communication between the faces of the body by removing a portion of the face of the body opposite the face against which the flux is applied to expose the ends of the channels within the body.

7. The method of claim 1 wherein the step of applying the flux in selected areas includes the step of applying a patterned etch mask to said body for establishing the selected areas.

8. The method of claim 7 wherein the etch mask is a photopolymer.

9. The method of claim 7 wherein the etch mask is an etch resistant metal.

10. The method of claim 7 wherein the etch mask is an etch resistant oxide or nitride.

11. The method of claim 1 wherein the step of activating the microchannels includes forming a secondary electron emissive layer on the walls of the microchannels.

12. The method of claim 1 wherein the step of activating the microchannels comprises forming a current carrying layer on the walls of the microchannels.

13. The method of claim 1 wherein the step of activating the microchannels is accomplished by a chemical vapor deposition step.

14. The method of claim 1 wherein the step of activating the microchannels is accomplished by reaction with a reactive species.

15. The method of claim 1 wherein the step of activating the microchannels is accomplished by a liquid phase deposition step.

16. The method of claim 1 wherein the step of activating the microchannels includes selecting a membrane material which exhibits secondary electron emissivity when subjected to a flux of reactive species.

17. The method of claim 1 wherein the flux is a direction specific agent.

18. The method of claim 1 wherein the flux is an ion beam.

19. The method of claim 1 wherein the flux is generated by a glow discharge.

20. The method of claim 1 wherein the flux is a plasma assisted ion beam.

21. The method of claim 1 wherein the body is a semiconductor.

22. The method of claim 21 wherein the semiconductor is Si.

23. The method of claim 1 wherein selected areas are back filled with a material selected from the group consisting of: $Si_3N_4$, AlN, $Al_2O_3$, $SiO_2$, $Si_xN_yO_z$, and SiC.

24. The method of claim 1 further comprising forming an integrated structure having window portions bonded to the substrate by anodic bonding.

25. The method of claim 1 wherein the microchannels have wall portions with a length (l) and width (d) defining a selected aspect ratio $\propto = l/d$ and further including the step of:
   - increasing the aspect ratio by at least one of depositing dielectric material on wall portions after removing the material adjacent the membrane material and oxidizing the body prior to back filling.

26. A method for manufacturing an electron multiplier comprising forming a body of etchable material, directionally applying a flux of reactive particles against the body in selected areas for removing material therefrom in order to form at least one perforation; filling the perforation with a membrane material resistant to an etching process for material of the body and removing material of the body by said process around the filled perforation to form at least one channel in the membrane material suitable for receiving a thin-film dynode to support electron multiplication.

* * * * *